United States Patent
Wakabayashi

(10) Patent No.: US 8,999,103 B2
(45) Date of Patent: Apr. 7, 2015

(54) SUBSTRATE PROCESSING SYSTEM, SUBSTRATE PROCESSING METHOD AND STORAGE MEDIUM

(75) Inventor: Shinji Wakabayashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1776 days.

(21) Appl. No.: 11/892,661

(22) Filed: Aug. 24, 2007

(65) Prior Publication Data

US 2008/0053957 A1 Mar. 6, 2008

Related U.S. Application Data

(60) Provisional application No. 60/844,650, filed on Sep. 15, 2006.

(30) Foreign Application Priority Data

Aug. 25, 2006 (JP) .................................. 2006-229626

(51) Int. Cl.
C23F 1/08 (2006.01)
H01L 21/3213 (2006.01)
H01L 21/67 (2006.01)

(52) U.S. Cl.
CPC ...... *H01L 21/32137* (2013.01); *H01L 21/6719* (2013.01); *H01L 21/67201* (2013.01); *Y10S 414/139* (2013.01)

(58) Field of Classification Search
USPC .......................... 118/719; 156/345.31, 345.32
See application file for complete search history.

(56) References Cited

U.S. PATENT DOCUMENTS

| | | | |
|---|---|---|---|
| 6,450,750 B1 * | 9/2002 | Heyder et al. | 414/217 |
| 6,491,832 B2 | 12/2002 | Yoshioka et al. | |
| 6,688,375 B1 * | 2/2004 | Turner et al. | 165/48.1 |
| 6,802,934 B2 * | 10/2004 | Saeki et al. | 156/345.31 |

FOREIGN PATENT DOCUMENTS

| | | | |
|---|---|---|---|
| JP | 2001-110663 | | 4/2001 |
| JP | 2005-50852 | | 2/2005 |
| KR | 2003059573 A | * | 7/2003 |

OTHER PUBLICATIONS

Japanese Office Action issued on Sep. 20, 2011 for Application No. 2006-229626 w/English language translation.

* cited by examiner

*Primary Examiner* — Karla Moore
(74) *Attorney, Agent, or Firm* — Smith, Gambrell & Russell, LLP

(57) ABSTRACT

In the vacuum substrate processing equipment of the present invention, a posttreatment chamber for carrying out a posttreatment in an atmospheric atmosphere adjoins a load-lock chamber. Products produced on a substrate during a vacuum process are removed by processing the substrate in the posttreatment chamber before the substrate is carried to an atmospheric carrying chamber in order to avoid or reduce adverse influence on the atmospheric carrying chamber. A carrying means installed in the said atmospheric carrying chamber carries the substrate to and from the said posttreatment chamber. The said posttreatment chamber and the atmospheric carrying chamber are separated from each other by a partition wall, and the partition wall is provided with an opening having the shape of a slit through which the said carrying means and the substrate can pass. The said carrying means carries the substrate into and out of the posttreatment chamber through the slit.

6 Claims, 9 Drawing Sheets

US 8,999,103 B2

SUBSTRATE PROCESSING SYSTEM, SUBSTRATE PROCESSING METHOD AND STORAGE MEDIUM

CROSS REFERENCE TO RELATED APPLICATIONS

This application is based upon and claims the benefit of priority from the prior Japanese Patent Application No. 2006-229626 filed on Aug. 25, 2006 and the Preliminary U.S. Pat. App. No. 60/844,650 filed on Sep. 15, 2006, the entire contents of which are incorporated herein by reference.

BACKGROUND OF THE INVENTION

1. Field of the Invention

The present invention relates to the field of techniques for avoiding or reducing the adverse influence of a product formed on a substrate by a vacuum process and exposed to the atmosphere on the components of an atmospheric carrying chamber when the substrate processed by the vacuum process is carried to the atmospheric carrying chamber.

2. Description of the Related Art

A substrate, such as a semiconductor wafer (hereinafter, referred to simply as "wafer"), is subjected to a vacuum process, such as a plasma processing process, for example, an etching process, to fabricate a semiconductor devices. A vacuum processing system called a multichamber system is used to carry out such a process at a high throughput.

FIG. 11 shows a known vacuum processing system provided with a vacuum processing chamber and an atmospheric carrying chamber by way of example. Referring to FIG. 11, this known vacuum processing system includes front opening unified pod (abbreviated to "FOUP")) tables 10 for supporting thereon a FOUP, namely, a carrying container containing a plurality of wafers, for example twenty-five wafers, a transfer module (TM) 11 provided with a carrying arm for carrying a wafer and maintaining a vacuum atmosphere, four process modules (PM) 12a, 12b, 12c and 12d for processing a wafer by predetermined processes in a vacuum atmosphere, a loader module (LM) 14 provided with a carrying mechanism including a carrying arm for carrying a wafer and maintained in an atmospheric atmosphere, two load-lock modules (LLM) 15a and 15b disposed between the loader module 14 and the transfer module 11, and capable of being selectively set in either of a vacuum atmosphere and a normal-pressure atmosphere, and an orienter (ORT), not shown, disposed so as to adjoin the loader module 14 for the prealignment of a wafer. In FIG. 11, indicated at G11 to G14 are gate valves.

A wafer carrying route in the vacuum processing system will be briefly described. A wafer to be processed taken out from a FOUP supported on the FOUP table 10 is carried along a carrying route passing the LM, the ORT, the LLM, the TM and the PM in that order. The wafer is processed by, for example, an etching process in the process module 12a (12b, 12c, 12d) in an atmosphere of a process gas. The wafer thus processed is carried along a carrying route passing the TM, the LLM and LM in that order and is returned to the FOUP supported on the FOUP table 10.

In some cases, gases generated by the reaction of byproducts produced on the wafer during processing the wafer with moisture contained in the atmosphere condense in liquids on wafers not yet processed during the operation for returning the processed wafer to the FOUP placed on the FOUP table 10. The liquids thus produced can cause defects in devices. A purge storage 13 is connected to the loader module 14 as indicated by broken lines in FIG. 11. The processed wafer is held temporarily in the purge storage 13 to prevent such cross-contamination.

However, the following problem arises when the processed wafer is carried from the load-lock module 15a (or 15b) through the loader module 14 to the purge storage 13. For example, a process gas, such as HBr gas or $Cl_2$ gas, is ionized in the process module 12a (12b, 12c, 12d) to generate a plasma for etching a polysilicon film formed on a wafer by an etching process. During the etching process, a byproduct, such as silicon bromide or silicon chloride, is produced on the wafer. When the wafer carrying the byproduct is carried into the loader module 14 in the atmospheric atmosphere, the silicon bromide or the silicon chloride react with moisture contained in the atmosphere and, consequently, a corrosive gas, such as hydrogen bromide gas or hydrogen chloride gas, is produced. The corrosive gas diffuses, and the corrosive gas reacts with a small amount of ammonia contained in the atmosphere to produce ammonium bromide particles or ammonium chloride particles. The particles diffuse in the loader module 14. Consequently, metal parts of the loader module 14, such as walls defining a carrying chamber, and components of the carrying mechanism, are corroded. It is possible that the corroded parts are abraded during mechanical motions and cause metal contamination. It is also possible that the particles adhere to the internal parts of the loader module 14 and cause particle contamination.

It is mentioned in JP-A 2005-50852 that entrained contaminants adhered to a sample in a plasma processing system react with moisture contained in the atmosphere to produce new contaminants or to create a corrosive environment that corrodes structural members. A carrying procedure intended to prevent such troubles mentioned in JP-A 2005-50852 carries a sample into or carries out a sample from an evacuated load-lock chamber in a state where a gas is supplied through a gas inlet port into the load-lock chamber, a gate valve on the side of the atmosphere is opened, the gas is supplied continuously into the load-lock chamber, a gas is supplied through a gas inlet port formed in a cover, and an atmosphere in the load-lock chamber is discharged through an exhaust port formed in the cover. However, even if currents is generated in the load-lock chamber to remove contaminants adhering to a wafer, the contaminants cannot be removed by the currents in a short time because the wafer can be held in the load-lock chamber only a short time in consideration of throughput.

SUMMARY OF THE INVENTION

The present invention has been made in view of such problems and it is therefore an object of the present invention to provide techniques capable of avoiding or reducing the adverse influence of a product formed on a substrate by a process executed in a vacuum chamber on an atmospheric carrying chamber when the substrate processed in the vacuum chamber is carried to the atmospheric carrying chamber.

A substrate processing system according to the present invention includes: a carrier table for supporting thereon a substrate carrier containing a plurality of substrates; a vacuum processing chamber in which a substrate is processed in a vacuum atmosphere; a load-lock chamber, through which a substrate is sent out to and received from the vacuum processing chamber, capable of being selectively set in either of a vacuum atmosphere and a normal-pressure atmosphere; a posttreatment chamber adjoining the load-lock chamber to process in an atmospheric atmosphere a processed substrate processed by a vacuum process to remove products produced on the substrate by the vacuum process; and an atmospheric carrying chamber interposed between the load-lock chamber and the carrier table and provided with a carrying means for carrying a substrate in an atmospheric atmosphere.

Preferably, a substrate is carried into and carried out of the posttreatment chamber by the carrying means installed in the atmospheric carrying chamber. Preferably, the following constitution is employed when a substrate is carried into and carried out of the posttreatment chamber.

(1) The posttreatment chamber and the atmospheric carrying chamber are separated from each other by a partition wall, and the partition wall is provided with an opening having the shape of a slit through which the carrying means and a substrate can pass.

(2) A gate valve disposed between the atmospheric carrying chamber and the load-lock chamber serves also as a gate valve between the load-lock chamber and the posttreatment chamber.

(3) The load-lock chamber is provided with a gateway bent with respect to a longitudinal direction, and the gate valve has a valve element bent so as to conform to the gateway.

A condition expressed by "bent" is either of a condition where a structure is bent in the shape of a chevron and a condition where a structure is bent in the shape of a circular arc (curved).

Preferably, the load-lock chamber of the substrate processing system according to the present invention includes a first load-lock chamber and a second load-lock chamber disposed symmetrically with respectively to a longitudinal direction behind the atmospheric carrying chamber, and the posttreatment chamber is disposed between the first and the second load-lock chamber. The posttreatment chamber may be provided with, for example, a substrate holding unit capable of holding substrates in a plurality of layers. Preferably, the substrate holding unit of the posttreatment chamber can be vertically moved by a lifting means. The posttreatment chamber is used for promoting the reaction of products formed on a substrate while the substrate is being processed with moisture contained in the atmosphere.

A substrate processing method according to the present invention includes the steps of: processing a substrate in a vacuum processing chamber; carrying the processed substrate from the vacuum processing chamber to a load-lock chamber; changing a vacuum atmosphere in the load-lock chamber for a normal-pressure atmosphere; carrying the substrate from the load-lock chamber to a posttreatment chamber adjoining the load-lock chamber; processing the substrate by a posttreatment in an atmospheric atmosphere to remove products produced by a vacuum process from the substrate; and carrying the substrate from the posttreatment chamber to an atmospheric carrying chamber disposed between a carrier table on which a carrying container containing a plurality of substrates is placed and the load-lock chamber, and provided with a carrying means for carrying the substrate in an atmospheric atmosphere.

A storage medium according to the present invention storing a computer program to be executed by a substrate processing system for processing a substrate in a vacuum atmosphere; wherein the computer program specifies the steps of a substrate processing method according to the present invention.

According to the present invention, the products produced on the substrate by the vacuum process are removed in the posttreatment chamber adjoining the load-lock chamber before the substrate is carried to the atmospheric carrying chamber. Therefore, adverse effects of the products on the components of the atmospheric carrying chamber, such as the walls of the atmospheric carrying chamber and components of a carrying mechanism installed in the atmospheric carrying chamber, can be prevented or reduced. The posttreatment chamber does not need to be provided with a special carrying means when the carrying means installed in the atmospheric carrying camber is used for carrying a substrate into and carrying a substrate out of the posttreatment chamber. Thus the substrate processing system can be built in simple construction and at a low cost. A substrate can be efficiently carried when one and the same gate valve is used to separate the atmospheric carrying chamber and the load-lock chamber from each other, and to separate the load-lock chamber and the posttreatment chamber from each other.

DESCRIPTION OF THE PREFERRED EMBODIMENTS

Figure 1:
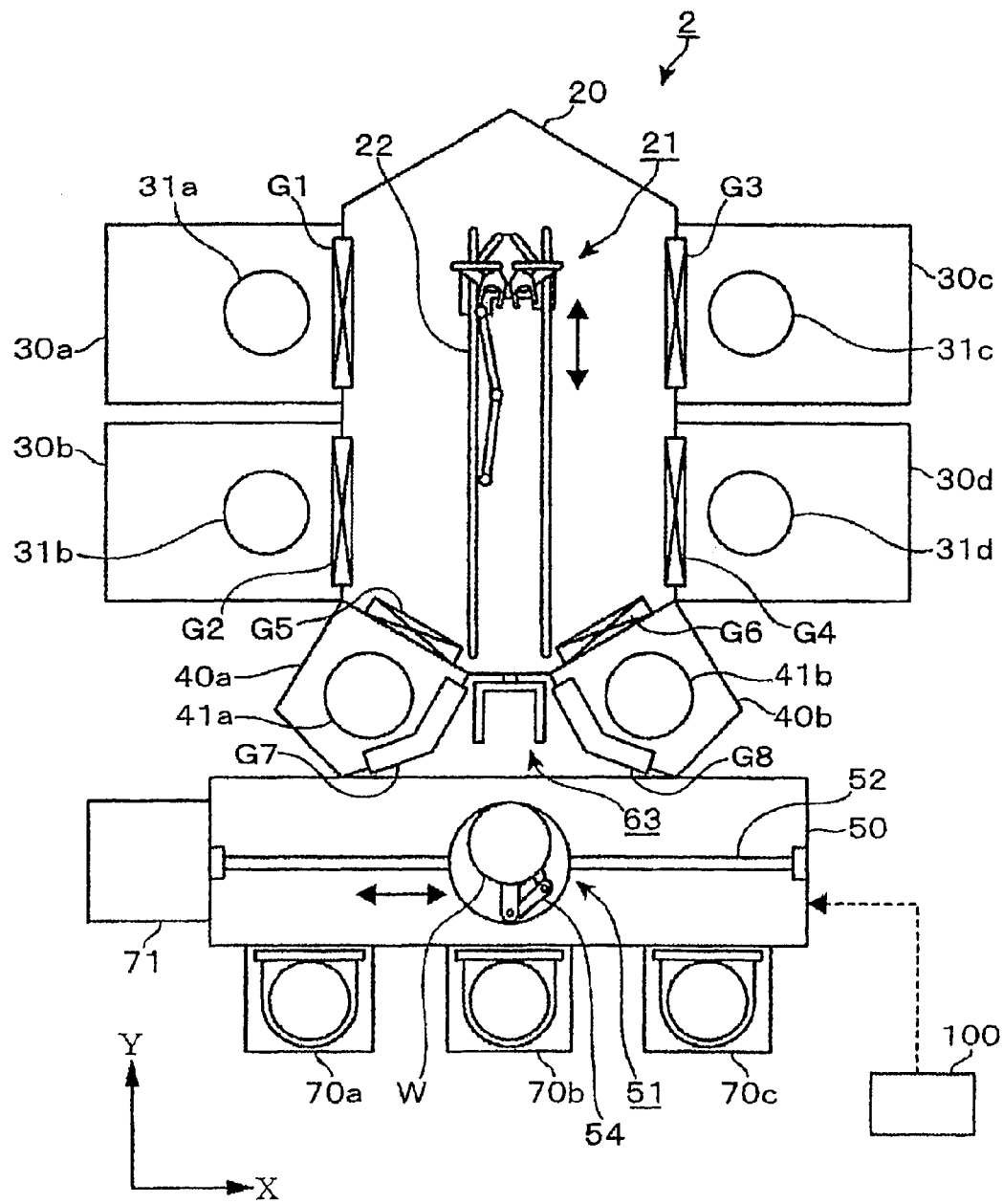
FIG. 1 is a plan view of a substrate processing system in a first embodiment according to the present invention.
Figure 2:
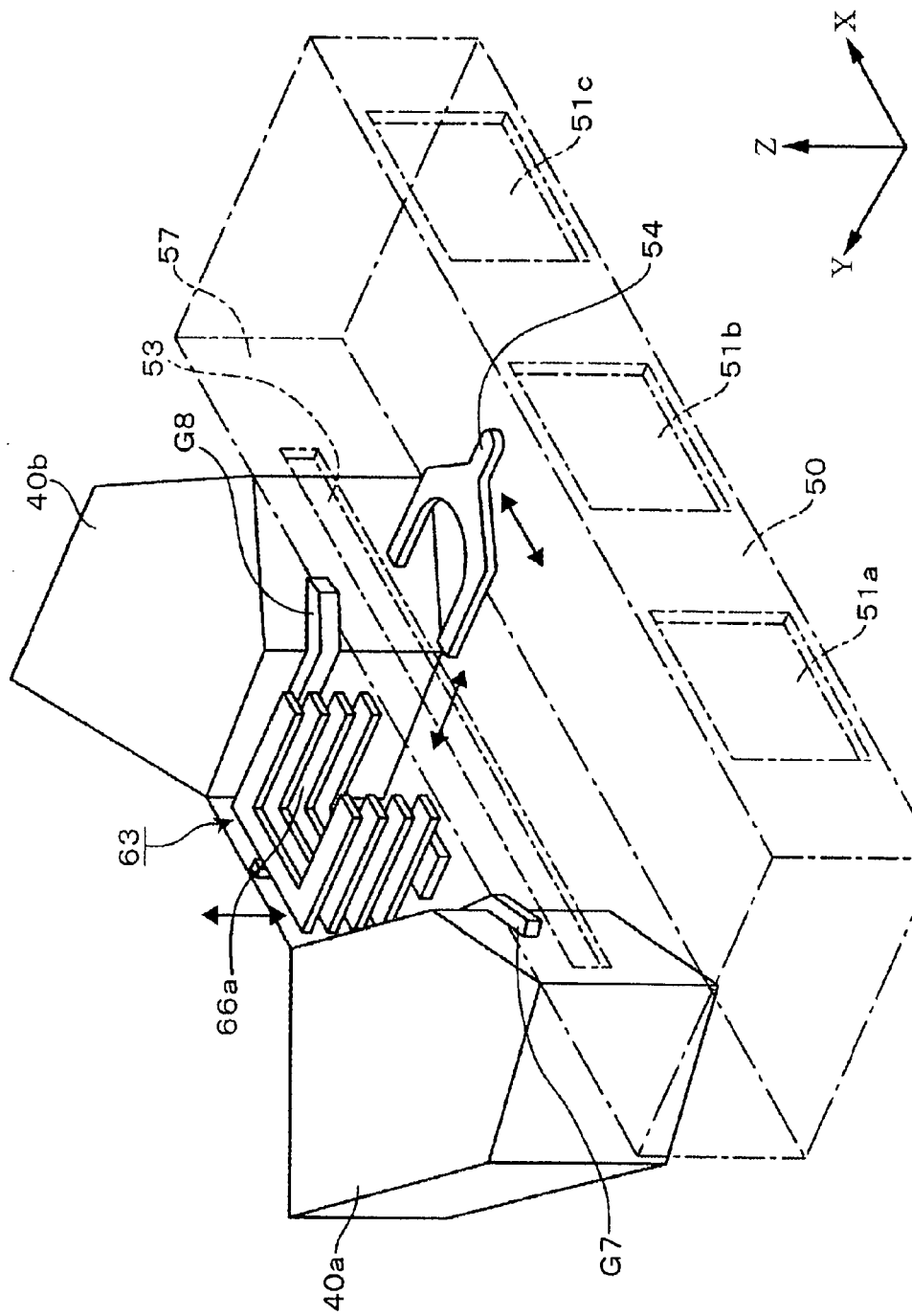
FIG. 2 is a perspective view of an important part of the substrate processing system shown in FIG. 1.

FIG. 1 is a plan view of a substrate processing system in a first embodiment according to the present invention, and FIG. 2 is a schematic perspective view of an important part of the substrate processing system shown in FIG. 1. Referring to FIG. 1, the substrate processing system 2 carries semiconductor wafers (hereinafter, referred to simply as "wafers") W, namely, substrates, one by one and processes the wafers W by a predetermined process. The substrate processing system 2 includes a transfer module (TM) 20 having a longitudinally elongate hexagonal shape in a plane, two process modules (PM) 30a and 30b disposed near one longitudinal side surface of the transfer module 20 extending in a longitudinal direction parallel to the Y-axis, two process modules 30c and 30d disposed near the other longitudinal side surface of the transfer module 20, two load-lock modules (LLM) 40a and 40b connected to two oblique end surfaces of the transfer module 20 inclined to a transverse direction parallel to the X-axis, and a loader module 50 extending beside the load-lock modules 40a and 40b. The load-lock modules 40a and 40b correspond to a first load-lock chamber and a second load-lock chamber, respectively.

The process modules 30a to 30d are provided with wafer stages 31a to 31d for supporting a wafer in a vacuum processing chamber, electrodes for generating a plasma, and process gas supply systems for supplying a process gas, such as hydrogen bromide gas (HBr gas) into the vacuum processing chambers, respectively. High-frequency power is supplied to the electrodes to generate a plasma by ionizing the process gas. An etching process etches, for example, a polysilicon film formed on a wafer W by using the plasma.

Gate valves G1, G2, G3 and G4 are disposed at the joints of the transfer module 20 and the process modules 30a to 30d, respectively. The transfer module 20 is provided with a carrying arm unit 21 installed in a vacuum carrying chamber and including two scalar arm type carrying arms. The carrying arm unit 21 moves along guide rails 22 extended longitudinally i.e., in parallel to the Y-axis, in the transfer module 20 to carry a wafer W to and from the process modules 30a to 30d and the load-lock modules 40a and 40b.

Figure 3:
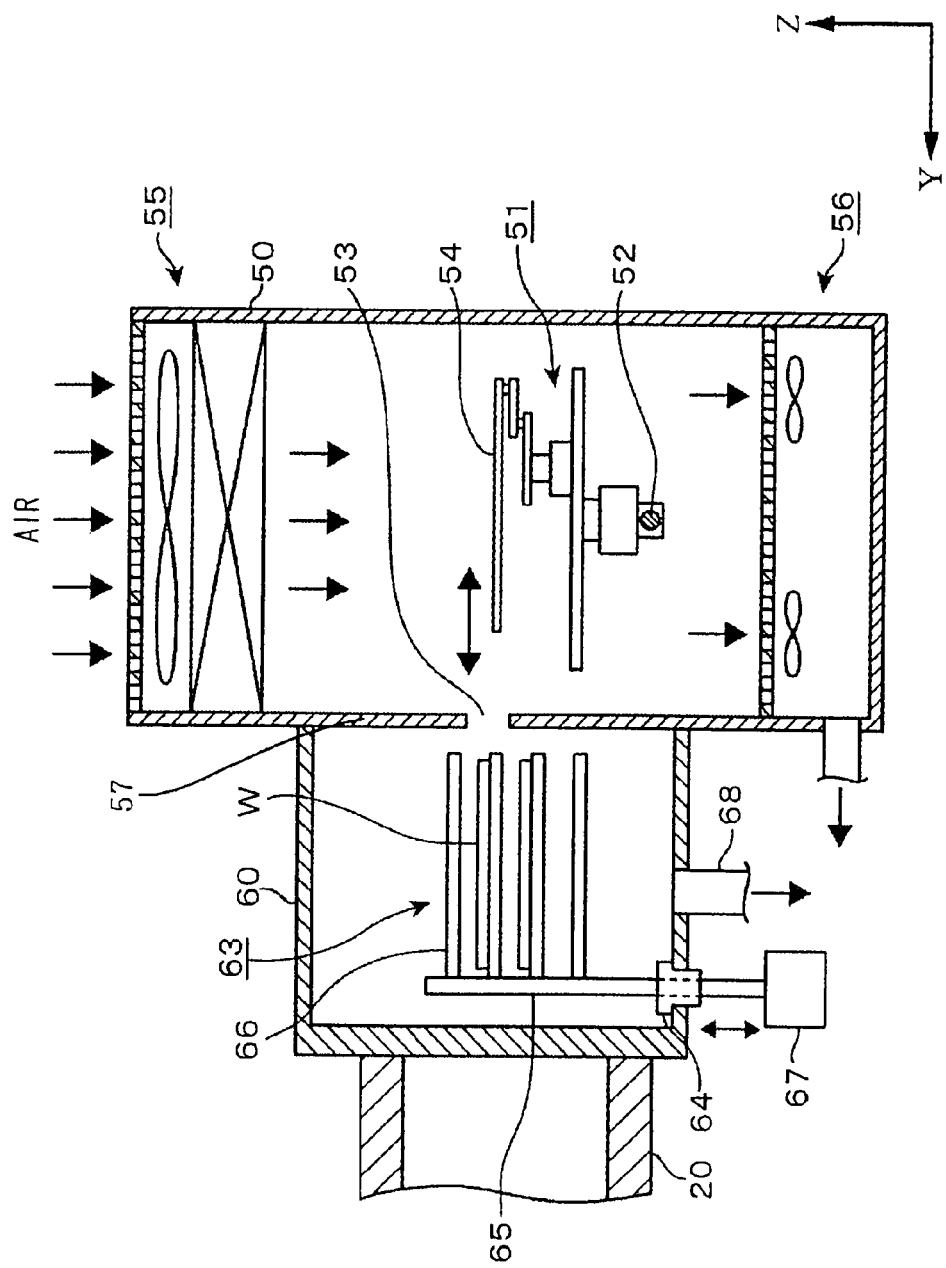
FIG. 3 is a schematic sectional view of a purge storage.

The loader module 50 has the shape of a transversely elongate box. As shown in FIG. 3, a filter fan unit (FFU) 55 formed by combining a filter and a fan is attached to the top wall of the loader module 50. An exhaust fan unit 56 is combined with the floor of the loader module 50. The exhaust fan unit 56 is connected to a plant exhaust system provided with a detoxification unit. A downward stream of clean air is produced between the FFU 55 and the exhaust fan unit 56. The rear wall 57 of the loader module 50 is provided with an opening 53 having the shape of a slit.

A carrying arm mechanism 51 is installed in the loader module 50. As shown in FIG. 2, three openings 51a, 51b and 51c are formed in the front wall of the loader module 50 facing FOUP tables 70. Wafers W are carried into and out of the loader module 50 through the openings 51a, 51b and 51c. The carrying arm mechanism 51 includes an X-axis moving member electromagnetically driven for reciprocation along a guide rail 52 transversely extended in the loader module 50, a horizontal swivel table supported for turning in a horizontal plane by an X-axis lifting mechanism on the X-axis moving member, and an articulated carrying arm 54 mounted on the swivel table and capable of extending in radial directions and horizontal directions. The carrying arm 54 has a fork-shaped holding part as shown in FIG. 2. A peripheral part of the lower surface of a wafer W is seated on the holding part.

The load-lock modules 40a and 40b are disposed symmetrically with respect to the longitudinal axis of the transfer module 20 between the rear wall of the loader module 50 and the transfer module 20. Gate valve G5 and G6 are disposed at the joints of the load-lock modules 40a and 40b and the transfer module 20, respectively. The load-lock modules 40a and 40b are provided with wafer stages 41a and 41b for supporting a wafer W thereon, respectively. The respective internal spaces of the load-lock modules 40a and 40b can be selectively set in a vacuum atmosphere or a normal-pressure atmosphere of, for example, nitrogen gas.

The load-lock modules 40a and 40b have a pentagonal cross-sectional shape. An opening 42a (42b) through which a wafer is carried into and carried out from the load-lock module 42a (42b) is formed in a side wall of the load-lock module 40a (40b) facing the load-lock module 42b (42a). The openings 42a and 42b are closed by gate valves G7 and G8, respectively. As shown in FIGS. 1 and 2, each of the gate valves G7 and G8 is bent, for example, in the shape of a chevron so as to extend along the two adjacent sides of the pentagonal cross-sectional shape. The gate valves G7 and G8 separate the respective interiors of the load-lock modules 40a and 40b from the loader module 50 and a purge storage (PST) 60, respectively. The gate valves G7 and G8 isolate the load-lock modules 40a and 40b, respectively, from the purge storage 60. The construction and operation of the gate valves G7 and G8 will be described later.

In the substrate processing system 2, the rear wall 57 of the loader module 50, the two sides of each of the load-lock modules 40a and 40b, and one side of the transfer module 20 define a processing chamber of the purge storage 60, namely, a posttreatment chamber. A posttreatment is carried out by the purge storage 60 to convert products produced by a plasma processing process, namely, a vacuum process, and capable of changing into a substance detrimental to the components of the loader module 50 when exposed to an atmospheric atmosphere into a corrosive gas by making the products react with moisture contained in the atmosphere and to dissipate the corrosive gas.

Referring to FIGS. 2 and 3, a substrate holding device 63 is disposed in the purge storage 60. The substrate holding device 63 in this embodiment can hold a plurality of wafers @, four wafers W in this embodiment, in layers. The substrate holding device 63 includes a base 64 set on the bottom wall the purge storage 60, a post 65 set upright at one end of the base 64, a plurality of support arms 66, four support arms 66 in this embodiment, and a lifting mechanism 67 for vertically moving the post 65. As shown in FIG. 2 by way of example, the support arms 66 are formed in a U-shape to form a central space 66a. The carrying arm 54 can enter the central space 66a. The lifting mechanism 67 can position the selected one of the four support arms 66 at a position corresponding to a transfer level where the carrying arm 54 can transfer a wafer W to the selected one of the four support arms 66.

An exhaust pipe 68 has one end connected to the bottom wall of the purge storage 60 and the other end connected to a plant exhaust system provided with a detoxification unit. Clean air flowed from the loader module 50 through the slit-shaped opening 53 into the purge storage 60 is discharged through the exhaust pipe 68 into the plant exhaust system.

FOUP tables 70a to 70c are disposed on the side of the front wall of the loader module 50. FOUPs (front opening unified pods), namely, wafer carriers, each containing a plurality of wafers W, for example twenty-five wafers W and carried through the openings 51a to 51c are placed on the FOUP tables 70a to 70c, respectively. An orienter (ORT) 71 adjoins the left wall, as viewed in FIG. 1, of the loader module 50. The orienter 71 aligns beforehand the wafer W carried from each of the FOUP tables 70a to 70c into the loader module 50.

Figure 4:
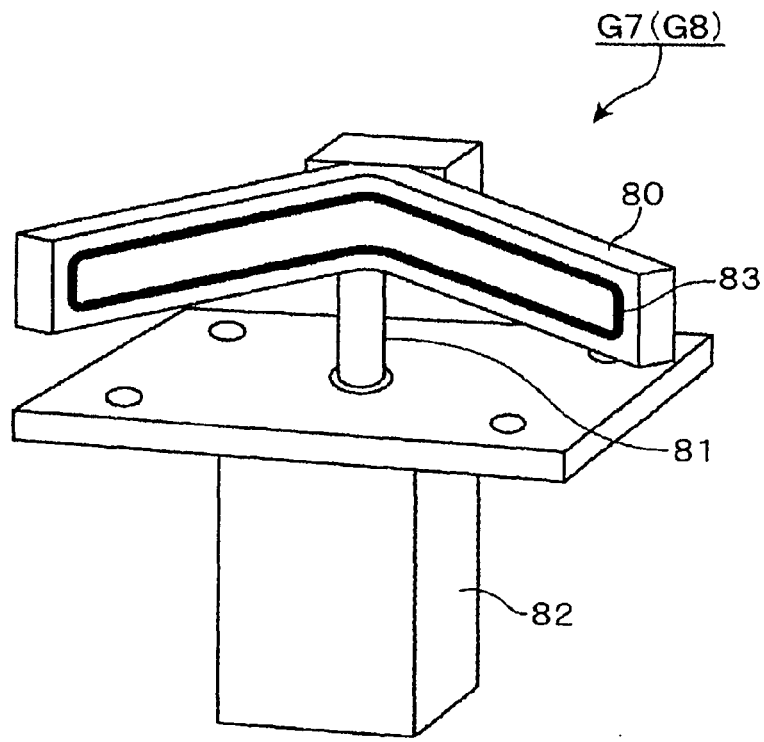
FIG. 4 is a schematic perspective view of a gate valve interposed between a load-lock module and the purge storage.
Figures 5A, 5B:
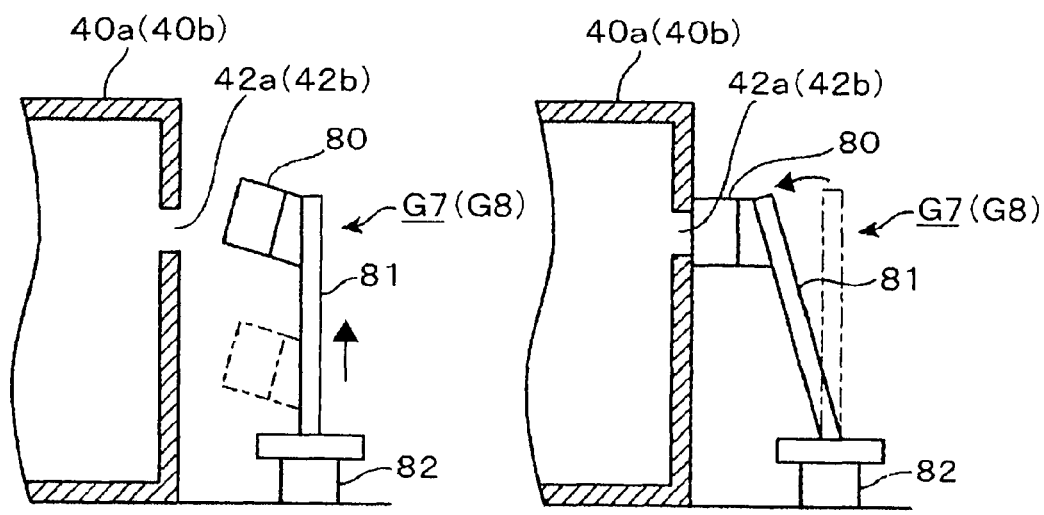
FIGS. 5A and 5B are schematic views of assistance in explaining operations of the gate valve shown in FIG. 4.

The gate valves G7 and G8 linked with the walls of the load-lock modules 40a and 40b, respectively, will be described. Referring to FIG. 4, the gate valve G7 (G8) includes a chevron-shaped valve element 80, a valve stem 81 supporting the valve element 80, and a valve element moving mechanism 82 connected to the lower end of the valve stem 81. An O ring 83, namely, a resin ring, is attached to the inner surface of the valve element 80 t seal the joint of the wall of the load-lock module 40a (40b) and the valve element 80. To close the gate valve G7 (G8), first the valve element driving mechanism 82 raises the valve element 80 to a position at a predetermined height as shown in FIG. 5A. Subsequently, the valve element driving mechanism 82 tilts the valve stem 81 to press the valve element 80 against the side wall of the load-lock module 40a (40b) so as to close the opening 42a (42b) in an airtight fashion as shown in FIG. 5B. To open the gate valve G7 (G8), the foregoing closing procedure is reversed.

Figure 6:
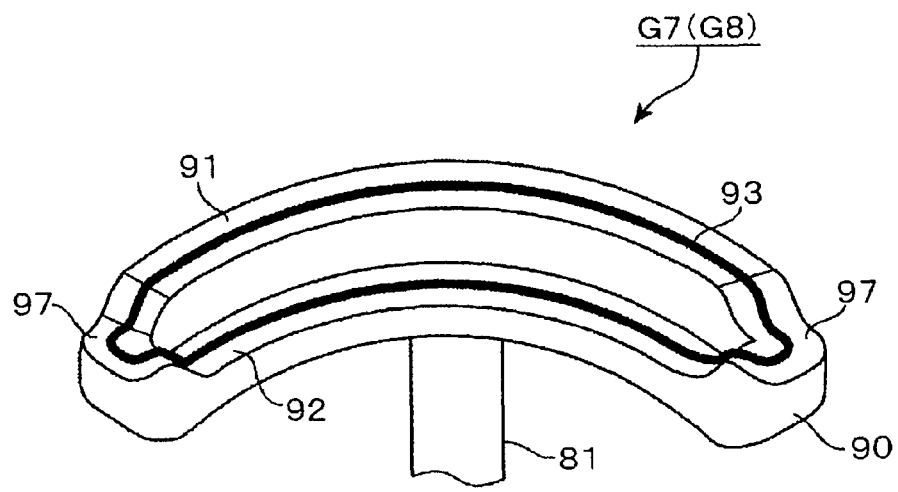
FIG. 6 is a schematic perspective view of another gate valve disposed between the load-lock module and the purge storage.
Figures 7A, 7B:
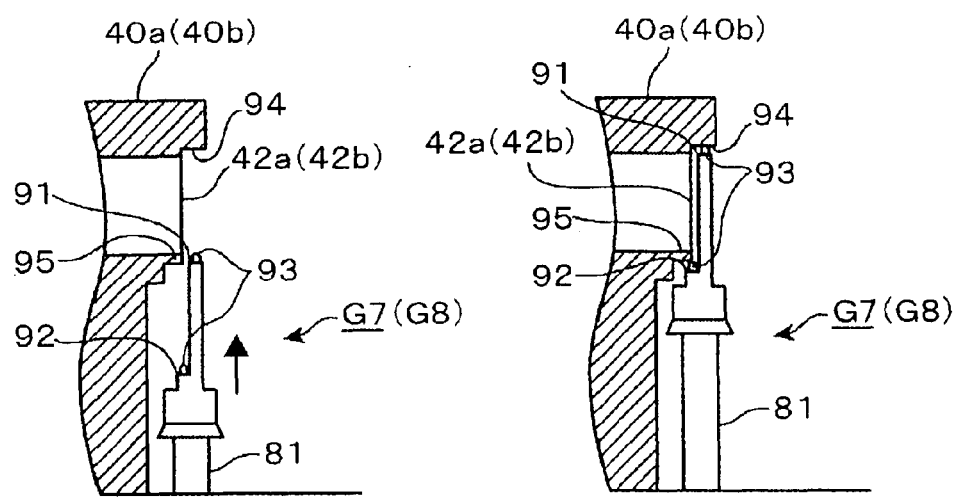
FIGS. 7A and 7B are schematic views of assistance in explaining operations of the gate valve shown in FIG. 6.

A gate valve G7 (G8) shown in FIG. 6 may be used. When the gate valve G7 (G8) shown in FIG. 6 is used, sealing surfaces facing down are formed along edges of the opening 42a (42b), and sealing surfaces facing up are formed in the gate valve G7 (G8). The gate valve G7 (G8) is raised to bring the sealing surfaces of the gate valve G7(G8) into close contact with the sealing surfaces of the opening 42a (42b) of the load-lock module 40a (40b) to seal the load-lock module 40a (40b). As shown in FIG. 7, the load-lock module 40a (40b) is provided with a lower sealing surface 95 facing down and extending along the lower edge of the opening 42a (42b) on the inner side of the outer end of the opening 42a (42b), an upper sealing surface 94 facing down and extending along the upper edge of the opening 42a (42b) on the outer side of the outer end of the opening 42a (42b), and side sealing surfaces, not shown, facing down and extending along the side edges of the opening 42a (42b) between the upper sealing surface 94 and the lower sealing surface 95. The valve element 90 is provided with sealing surfaces 91 and 92 facing up, extending along the upper and the lower edge of valve element 90, respectively, and corresponding to the upper sealing surface 94 and the lower sealing surface 95 of the load-lock module 40a (40b), respectively, and sealing surfaces 97 facing up and extending between the sealing surfaces 91 and 92. An O ring 93, namely, a resin ring, is attached to the sealing surfaces 91, 92 and 97. The valve element 90 is raised to bring the sealing surfaces 91, 92 and 97 facing up of the valve element 90 into close contact with the sealing surfaces 94 and 95 facing down of the opening 42a (42b) as shown in FIG. 78. Thus the horizontally elongate opening 42a (42b) formed in the wall of load-lock module 40a (40b) is closed in an airtight fashion as shown in FIG. 7B.

The substrate processing system 2 is provided with a controller 100. For example, the controller 100 is a computer. The controller executes control operations according to a computer program to control the sequential operations of the carrying arm unit 21, the carrying arm mechanism 51, the lifting mechanism 67 and the gate valves G1 to G8, and sequential steps of vacuum processes to be executed by the process modules 30a to 30d. The computer program is stored in a storage medium, such as a hard disk, a flexible disk, a compact disk, a magnetooptical disk (MO) or a memory card. The computer program stored in the storage medium is loaded into the controller 100.

Operation of the substrate processing system 2 will be described. A FOUP containing wafers W is delivered to the substrate processing system 2 and is placed on, for example, the FOUP table 70a, and the lid of the FOUP is removed. Then, the carrying arm 54 takes out a wafer W from the FOUP and brings the wafer W through the opening 51a into the loader module (LM) 50. The wafer W to be processed is transferred from the loader module 50 to the orienter (ORT) 71. The orienter 71 aligns the wafer W with respect to a predetermined direction. Then, the wafer W carried out of the orienter 71 by the carrying arm 54 is carried from the loader module (LM) 50 to the load-lock module 40a.

Figure 8A:
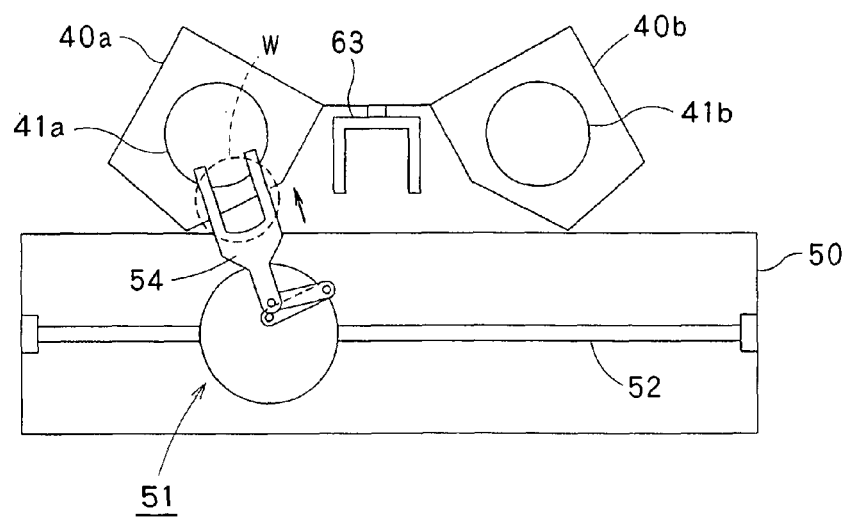
FIG. 8 is a view of assistance in explaining operations of a carrying arm included in a loader module.
Figure 8B:
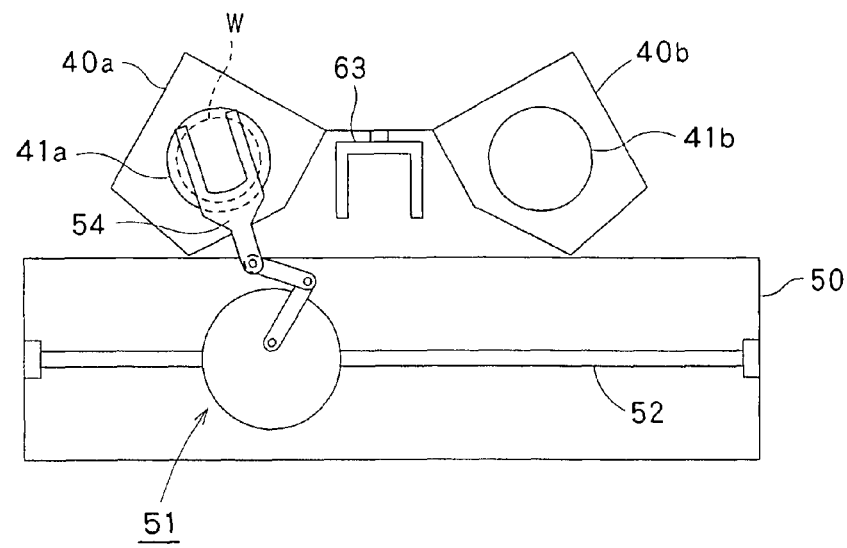

A carrying procedure for carrying the wafer W from the loader module (LM) 50 to the load-lock module (LLM) 40a by the carrying arm 54 will be described with reference to FIG. 8. The carrying arm mechanism 51 is positioned in front of, for example, the load-lock module (LLM) 40a as shown in FIG. 8A. Then, the carrying arm 54 is stretched out to advance the carrying arm 54 through the opening 42a formed in the wall of the load-lock module 40a into the load-lock module (LLM) 40a as shown in FIG. 8B. In FIG. 8, the wafer W supported on the carrying arm 54 is indicated by a chain line for the convenience of explanation.

Subsequently, the carrying arm unit 21 picks up the wafer W placed on the wafer stage 41a of the load-lock module (LLM) 40a and carries the wafer W into the transfer module (TM) 20. The wafer W is carried in the transfer module $^{TM}$ to, for example, the process module (PM) 30a. The process module (PM) 30a processes the wafer W by a plasma processing process, such as an etching process.

Then, the carrying arm unit 21 carries the processed wafer W from the process module (PM) 30a through the transfer module (TM) 20 to the load-lock module (LLM) 40a. Subsequently, a vent valve, not shown, is opened and, for example, nitrogen gas is supplied from an inert gas source, not shown, into the load-lock module (LLM) 40a to change a vacuum atmosphere in the load-lock module (LLM) 40a for a normal-pressure atmosphere. Then, the gate valve G7 is opened, and the carrying arm 54 carries the processed wafer W from the load-lock module (LLM) 40a to the purge storage (PST) 60.

Figure 9A:
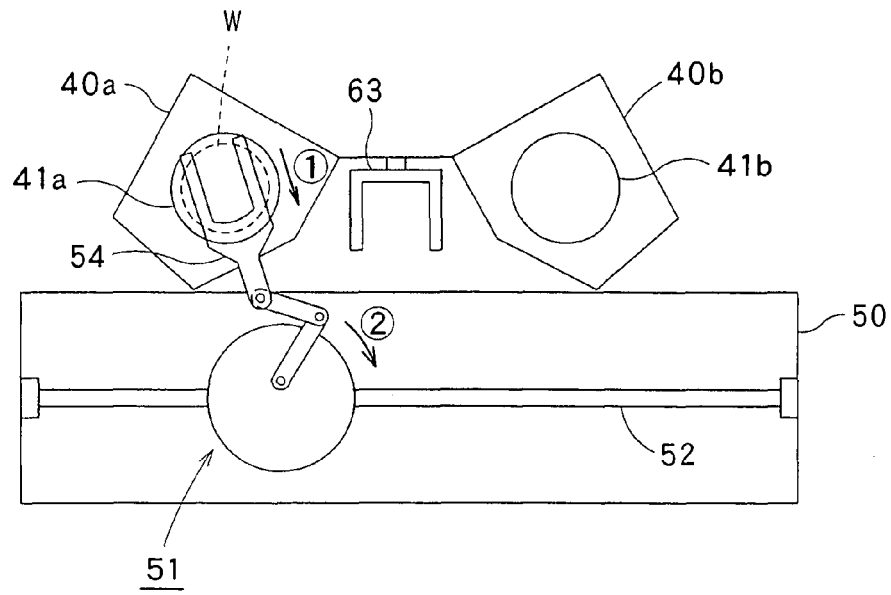
FIG. 9 is a view of assistance in explaining operations of the carrying arm included in the loader module.
Figure 9B:
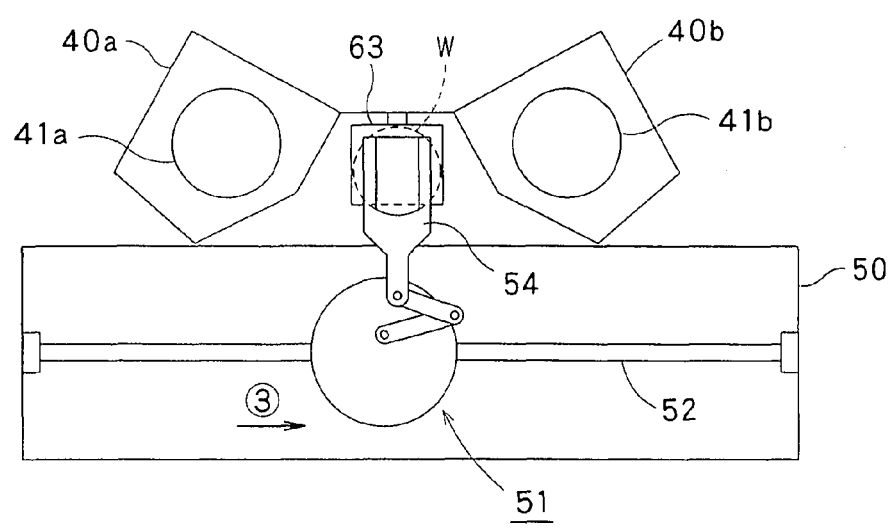

A procedure for carrying the processed wafer W by the carrying arm 54 from the load-lock module (LLM) 40a to the purge storage (PST) 60 will be described with reference to FIG. 9. The carrying arm mechanism 51 is positioned in front of the load-lock module (LLM) 40a, the carrying arm 54 is stretched out to advance the carrying arm 54 through the slit-shaped opening 53 formed in the rear partition wall 57 of the loader module (LM) 50 into the load-lock module (LLM) 40a. The processed wafer W is lifted up from the wafer stage 41a by lifting pins, not shown, the carrying arm 54 is raided from under the wafer W to transfer the wafer W to the carrying arm 54. Then, the carrying arm 54 is retracted to take out the wafer W from the load-lock module 40a, the carrying arm 54 is turned clockwise through a small angle, the carrying arm 54 is moved along the X-axis such that the holding part of the carrying arm 54 is positioned in a region extending over a space surrounded by the U-shaped support arm 66. Then, the support arms 66 are raised to pickup the wafer W from the carrying arm 54 so that a peripheral part of the wafer W is seated on the support arm 66. Then, the carrying arm 54 is retracted to a position in front of the support arms 66. Then, the support arms 66 are moved vertically and the carrying arm 54 is stretched out to receive a processed wafer W supported on another support arm 66 of the substrate holding device 63. The carrying arm 54 is formed in a transverse width smaller than the transverse width of a space 66a surrounded by the U-shaped support arm 66 to prevent the support arm 54 from interfering with the support arm 66 in a plane. The support arms 66 are moved down to transfer a wafer W supported on the support arm 66 to the carrying arm 54. Then, the carrying arm 54 returns the wafer W supported thereon to the FOUP placed on, for example, the FOUP table 70a.

The carrying arm 54 takes out another wafer W from the FOUP and carries the wafer W to the load-lock module (LLM) 40a. In FIG. 9, the wafer W supported on the carrying arm 54 is indicated by a chain line for the convenience of explanation.

A process to be carried out by the purge storage (PST) 60 to process a wafer W will be described. The purge storage (PST) 60 is evacuated continuously through the exhaust pipe 68 to maintain the interior of the purge storage (PST) 60 at a negative pressure. Therefore, the atmosphere flows from the loader module (LM) 50 through the slit-shaped opening 53 of the rear partition wall 57 of the loader module (LM) 50 into the purge storage (PST) 60. When a wafer W is subjected to a plasma etching process, a product produced during the plasma etching process, such as a silicon halide (for example, silicon bromide) adheres o the wafer W. The silicon halide reacts with moisture contained in the atmosphere to produce hydrogen bromide gas. The hydrogen bromide gas reacts with a small amount of ammonia contained in the atmosphere to produce ammonium bromide particles. The hydrogen bromide, namely, a corrosive gas, and the ammonium bromide particles are carried away by exhaust currents through the exhaust pipe 68. The hydrogen bromide gas is removed by a chemical filter, not shown, placed in the exhaust passage.

Sequential carrying operations for carrying the wafer W are determined by taking into consideration the number of the process modules (PM) to be used, processing times respectively needed by the process modules (PM) 30a to 30d, and time needed by the posttreatment to be carried out by the purge storage (PST) 60. Suppose that the four process modules (PM) 30a to 30d are used in a parallel operating mode for etching and the wafer W is held in each process module (PM) for a stay time t1 in this example. Then, a time needed by the posttreatment is expected to be (¾)t1. Thus a time that can be allotted for carrying a processed wafer W to either of the load-lock modules (LLM) 40a and 40b is (¼)t1. Therefore, the four support arms 66 are used; the three support arms 66 are used to enable each wafer W to stay in the purge storage (PST) for (¾)t1, and the one support arm 66 is used as a buffer. The processing time mentioned herein is only an example for typical explanation.

The sequential carrying operations may give priority to carrying a wafer W to and from the load-lock modules (LLM) 40a and 40b over carrying out a wafer W processed by the posttreatment from the purge storage (PST) 60. For example, even if a wafer W processed by the posttreatment is held in the purge storage (PST) 60 after a wafer W has been transferred from the load-lock module (LLM) 40 to the purge storage (PST) 60, first a wafer W may be carried from a FOUP placed on the FOUP table 70a to the empty load-lock module (LLM) 40a, and then the processed wafer W may be returned from the purge storage (PST) 60 to the FOUP placed on the FOUP table 70a.

Although either of the load-lock modules 40a and 40b may be used both for receiving a wafer W to be processed and for sending out a processed wafer W, either of the load-lock modules 40a and 40b may be used exclusively for receiving a wafer W to be processed and the other may be used exclusively for sending out a processed wafer W.

The foregoing embodiment exposes a wafer W processed by the plasma etching process to the atmospheric atmosphere in the purge storage (PST) adjoining the load-lock module (LLM) 40a or 40b to produce the corrosive gas by making the products produced during the etching process react with moisture contained in the atmosphere, dissipates the corrosive gas, and then carries the wafer to the loader module (LM) 50. Consequently, the production of particles through the reaction of the products with moisture can be suppressed, corrosion of the component parts of the loader module (LM) 50, namely, the walls of the atmospheric carrying chamber and the carrying mechanism installed in the atmospheric carrying chamber, can be suppressed, adhesion of particles to the component members can be suppressed, and contamination of the wafer W with the particles can be reduce.

A wafer W is carried to and carried out of the purge storage (PST) 60 by the carrying arm 54 in the loader module (LM) 50, defining the atmospheric carrying chamber. Therefore, any additional carrying system which might be necessary when the purge storages (PST) 60 are disposed respectively contiguously with the load-lock modules (LLM) 40a and 40b is not necessary. Since the purge storage (PST) 60 is disposed between the load-lock modules (LLM) 40a and 40b, a wafer W can be carried to and carrying out from either of the load-lock modules (LLM) 40a and 40b immediately after a wafer W has been carried to the purges storage (PST) 60 and immediately a wafer W has been carried out from the purge storage (PST) 60, the substrate processing system can process wafers at a high throughput and can be built in compact construction.

The substrate holding device 63 installed in the purge storage (PST) 60 is vertically movable and hence height necessary for transferring a wafer W by the carrying arm 54 between the support arm 66 of the substrate holding device 63 and the loader module 50 is limited, i.e., the carrying arm 54 does not need to be moved vertically. Therefore, the opening 53 formed in the rear partition wall 57 of the loader module 50 may have the shape of a slit having a small area as shown in FIG. 2. Consequently, the leakage of the corrosive gas from the purge storage (PST) 60 into the loader module (LM) 50 can be suppressed.

Each of the gate valves G7 and G8 combined respectively with the respective walls of the load-lock modules 40a and 40b has the chevron-shaped valve element 80 shown in FIG. 4 or the curved valve element 90 shown in FIG. 6. Therefore, the carrying arm 54 can carry a processed wafer W from the load-lock module 40a (40b) directly to the purge storage (PST) 60 by transversely moving the carrying arm 54 as shown in FIG. 9 instead of carrying the processed wafer W indirectly through the loader module (LM) 50 to the purge storage (PST) 60. Therefore, the stroke of the carrying arm 54 may be short, the carrying arm 54 can move along a circle of a short radius, the loader module (LM) 50 may be small and the substrate processing system can be built in compact construction.

The load-lock modules 40a and 40b may be provided with carrying arms, respectively, and processed wafers W may be carried from the load-lock modules 40a and 40b to the substrate holding device 63 of the purge storage 60 by the carrying arms of the load-lock modules 40a and 40b, respectively, and wafers W to be processed supported on the support arms 66 of the substrate holding device 63 may be carried to the load-lock modules 40a and 40b by the carrying arms of the load-lock modules 40a and 40b, respectively.

Figure 10:
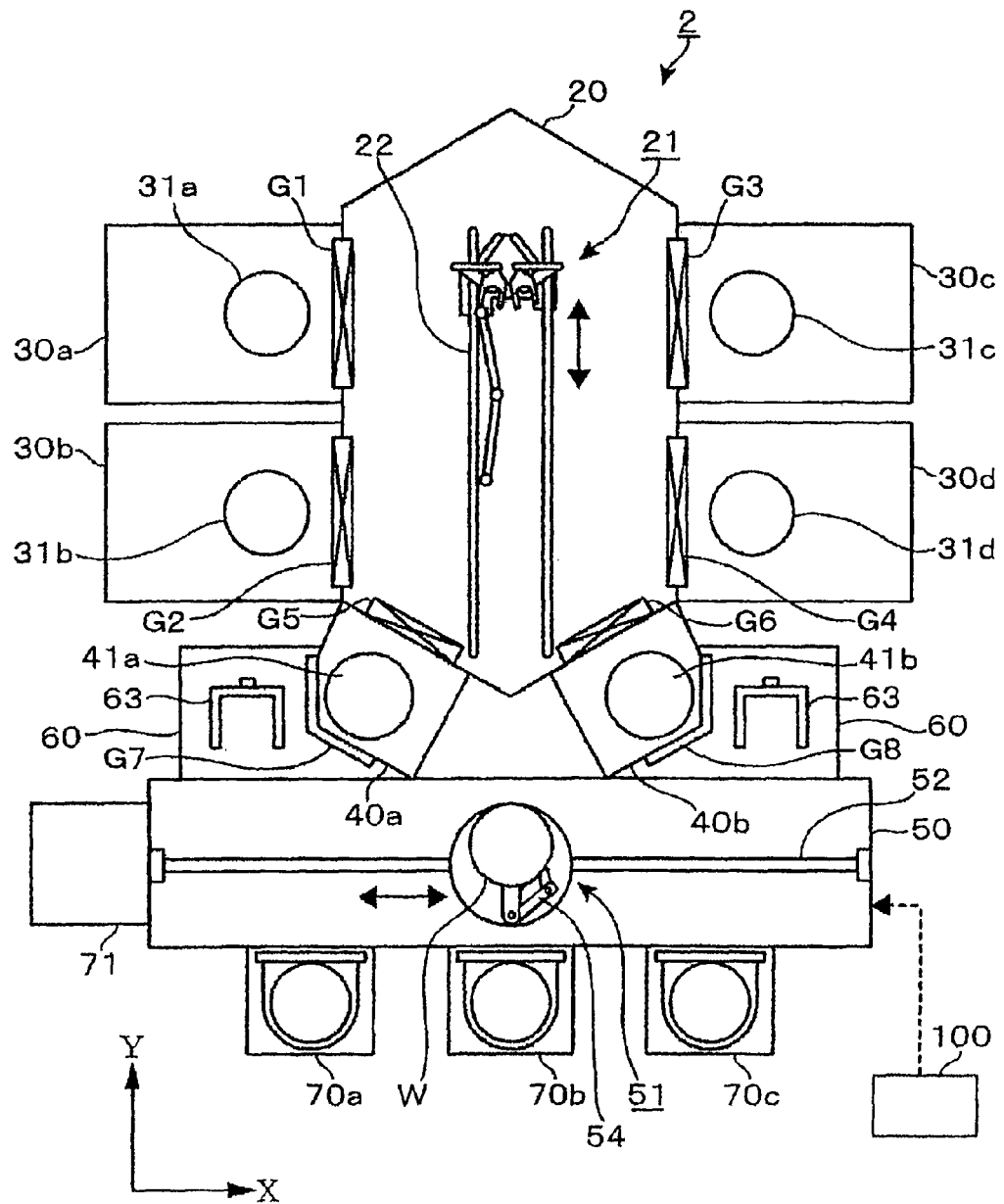
FIG. 10 is a plan view of a substrate processing system in a second embodiment according to the present invention.
Figure 11:
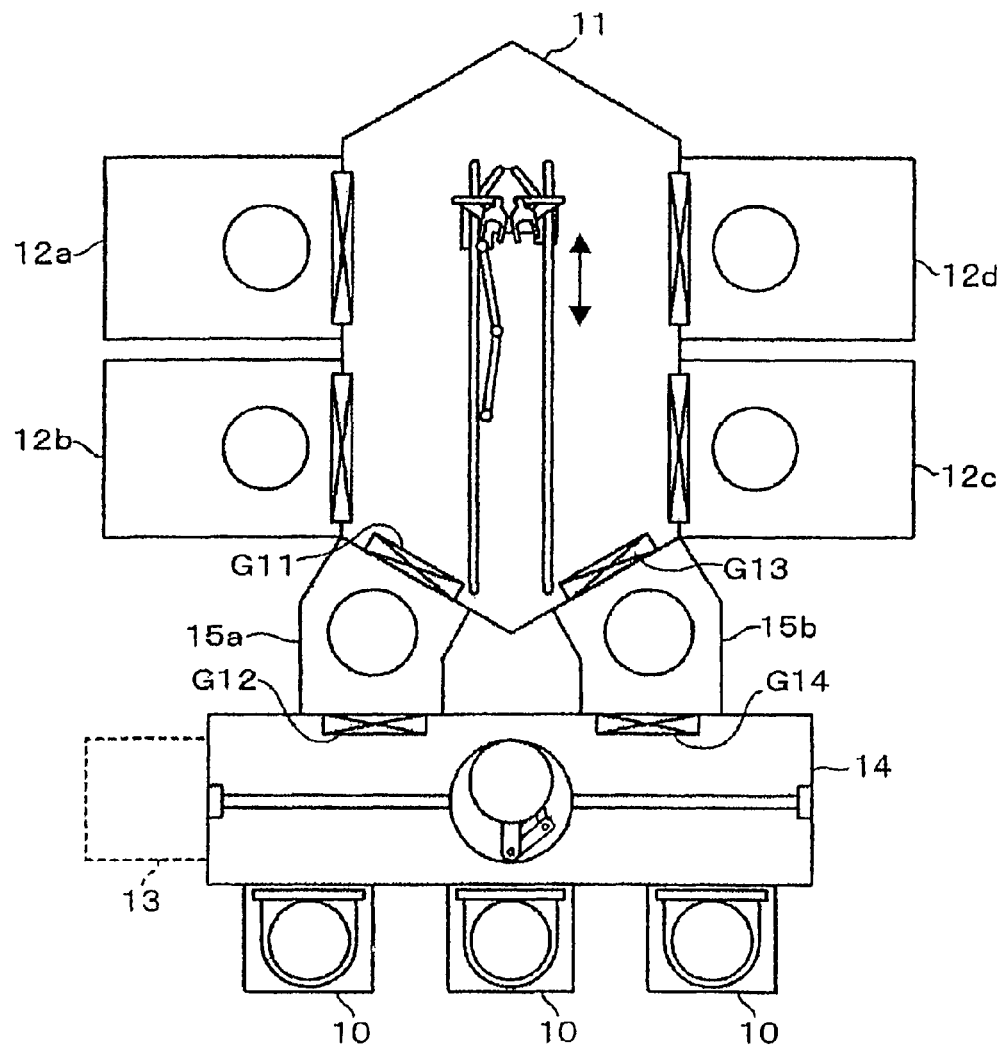
FIG. 11 is schematic plan view of a known substrate processing system.

In the first embodiment, the purge storage 60 is disposed between the load-lock modules 40a and 40b. In a substrate processing system 2 in a second embodiment, purge storages 60 are joined to the left side wall of the load-lock module 40a and the right side wall of the load-lock module 40b, respectively, as shown in FIG. 10. In the second embodiment, a gate valve G7 (G8) disposed between the load-lock module 40a (40b) and the purge storage 60 has a curved valve element, a processed wafer W placed on the wafer stage 41a (41b) of the load-lock module 40a (40b) is transferred to a substrate holding device 63 disposed in the purge storage 60 by picking up the processed wafer W from the wafer stage 41a (41b) and transversely moving the carrying arm 54 of a loader module 50. The second embodiment has the same effects as the first embodiment. A purge storage 60 may be connected only to either of the left side wall of the load-lock module 40a and the right side wall of the load-lock module 40b. In this case, the load-lock module 40a or 40b connected to the purge storage 60 is used exclusively for sending out a processed wafer W. In the substrate processing system 2 shown in FIG. 10, both the load-lock modules 40a and 40b may be provided with carrying arms, respectively, to carry wafers W from the load-lock modules 40a and 40b to the purge storage 60 by those carrying arms, respectively.

What is claimed is:
1. A substrate processing system comprising:
  a carrier table for supporting thereon a plurality of substrates;
  a vacuum processing chamber in which a substrate is processed by a vacuum process in a vacuum atmosphere;
  a vacuum carrying chamber, having a longitudinal axis and a plurality of joints, in which a carrying arm is installed, for carrying a substrate to and from the vacuum processing chamber by the carrying arm, wherein the vacuum carrying chamber is adjoined with the vacuum processing chamber through a first gate valve;

first and second load lock chambers disposed symmetrically with respect to the longitudinal axis of the vacuum carrying chamber and capable of being selectively set in either of a vacuum atmosphere and a normal pressure atmosphere, each separately adjoined with the vacuum carrying chamber through second and third gate valves, respectively, through which a substrate is sent out to and received from the vacuum carrying chamber;

a posttreatment chamber disposed between the first and second load-lock chambers via respective chevron-shaped gateways bent with respect to the longitudinal axis of the vacuum carrying chamber, wherein the posttreatment chamber is provided to process in an atmospheric atmosphere a processed substrate processed by the vacuum processing chamber;

fourth and fifth gate valves provided at each of the respective chevron-shaped gateways to separate the first and second load-lock chambers, respectively, from the posttreatment chamber, wherein the fourth and fifth gate valves are bent so as to conform to the shape of the respective chevron-shaped gateways;

an atmospheric transfer chamber having an axis transverse to the longitudinal axis and interposed between the first load-lock chamber, the second load lock chamber and the carrier table and provided with a carrying means for sending out and receiving a substrate from in an atmospheric atmosphere, wherein the carrying arm can carry a processed substrate from either of the first load-lock chamber or the second load-lock chamber to the posttreatment chamber directly by transversely moving the processed substrate through chevron-shaped gateways and the fourth and fifth gate valve;

and a partition wall separating the post treatment chamber and the atmospheric carrying chamber that is provided a partition wall and a third opening in the partition wall having the shape of a slit, wherein the carrying means and a substrate can pass through the slit without passing through the posttreatment chamber directly.

2. The substrate processing system according to claim 1, wherein a substrate is carried into and carried out of the posttreatment chamber by the carrying means installed in the atmospheric carrying chamber.

3. The substrate processing system according to claim 1, wherein the posttreatment chamber is provided with a substrate holding unit capable of holding substrates in a plurality of layers.

4. The substrate processing system according to claim 3, wherein the substrate holding unit can be vertically moved by a lifting means.

5. The substrate processing system according to claim 1, wherein the posttreatment chamber is used for promoting the reaction of products previously formed by the vacuum process on a substrate with moisture contained in the atmosphere.

6. The substrate processing system according to claim 1, wherein the posttreatment chamber is interposed between the load-lock chamber and the partition wall.

* * * * *